United States Patent
Daley et al.

(10) Patent No.: US 9,559,162 B2
(45) Date of Patent: Jan. 31, 2017

(54) THERMORESISTANCE SENSOR STRUCTURE FOR INTEGRATED CIRCUITS AND METHOD OF MAKING

(71) Applicant: GLOBALFOUNDRIES INC., Grand Cayman (KY)

(72) Inventors: Douglas M. Daley, Wilshire (GB); Hung H. Tran, Hopewell Junction, NY (US); Wayne H. Woods, Jr., Burlington, VT (US); Ze Zhang, Essex Junction, VT (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 729 days.

(21) Appl. No.: 13/921,988

(22) Filed: Jun. 19, 2013

(65) Prior Publication Data
US 2014/0376595 A1    Dec. 25, 2014

(51) Int. Cl.
| G01K 7/00 | (2006.01) |
|---|---|
| H01L 29/06 | (2006.01) |
| H01L 49/02 | (2006.01) |
| H01L 27/08 | (2006.01) |
| G01K 7/18 | (2006.01) |
| G01K 7/20 | (2006.01) |

(52) U.S. Cl.
CPC ........... *H01L 29/0649* (2013.01); *G01K 7/186* (2013.01); *G01K 7/20* (2013.01); *H01L 27/0802* (2013.01); *H01L 28/20* (2013.01)

(58) Field of Classification Search
USPC ............................. 374/E7.018, E7.035, 185
See application file for complete search history.

(56) References Cited

U.S. PATENT DOCUMENTS

| 4,346,291 | A | 8/1982 | Chapel et al. |
|---|---|---|---|
| 5,831,643 | A | 11/1998 | Chung |
| 6,320,450 | B1 | 11/2001 | Lee et al. |
| 6,489,831 | B1 | 12/2002 | Matranga et al. |
| 7,009,268 | B2 | 3/2006 | Yang et al. |
| 7,290,453 | B2 | 11/2007 | Brosh |
| 7,573,391 | B2 | 8/2009 | Adam |
| 7,659,176 | B2 | 2/2010 | Coolbaugh et al. |
| 7,718,967 | B2 | 5/2010 | Lane et al. |
| 2009/0001336 | A1* | 1/2009 | Habib ............ G01K 7/16 257/2 |

(Continued)

OTHER PUBLICATIONS

Hacine et al., "A micro-power high resolution SIGMADelta CMOS temperature sensor", 2011 IEEE Sensors Conference, Oct. 28-31, 2011, Limerick, Ireland.

(Continued)

*Primary Examiner* — Lisa Caputo
*Assistant Examiner* — Nasir U Ahmed
(74) *Attorney, Agent, or Firm* — Michael LeStrange; Hoffman Warnick, LLC

(57) ABSTRACT

A first pair of resistors formed in a first layer of material, and a second pair of resistors formed in the first layer or in a second layer can be wired into a Wheatstone bridge to form a temperature sensor. Either layer can include a semiconductor or a dielectric. In a semiconductor layer, a pair of resistors can be doped areas of the layer, while in a dielectric, a pair of resistors can be material deposited in cavities in the layer, such as material from an added "middle-of-line" (MOL) metallization layer.

18 Claims, 11 Drawing Sheets

(56) References Cited

U.S. PATENT DOCUMENTS

| | | | |
|---|---|---|---|
| 2010/0038540 A1* | 2/2010 | Hannebauer | G01J 3/36 |
| | | | 250/338.1 |
| 2010/0038754 A1* | 2/2010 | Abadeer | H01L 23/5256 |
| | | | 257/538 |
| 2010/0073122 A1* | 3/2010 | Le Neel | H01C 17/265 |
| | | | 338/25 |
| 2011/0080933 A1 | 4/2011 | Rivero | |
| 2011/0317741 A1 | 12/2011 | Seefeld et al. | |
| 2013/0168815 A1* | 7/2013 | Le Neel | G01K 7/20 |
| | | | 257/536 |

OTHER PUBLICATIONS

Shor, "Radiometric BJT-Based Thermal Sensor in 32nm and 22nm Technologies", 2012 IEEE International Solid-State Circuits Conference.

Pertijs et al., "A CMOS Smart Temperature Sensor with a 3 Inaccuracy of .5C From −50C to 120C", IEEE Journal of Solid-State Circuits, vol. 40, No. 2, Feb. 2005.

\* cited by examiner

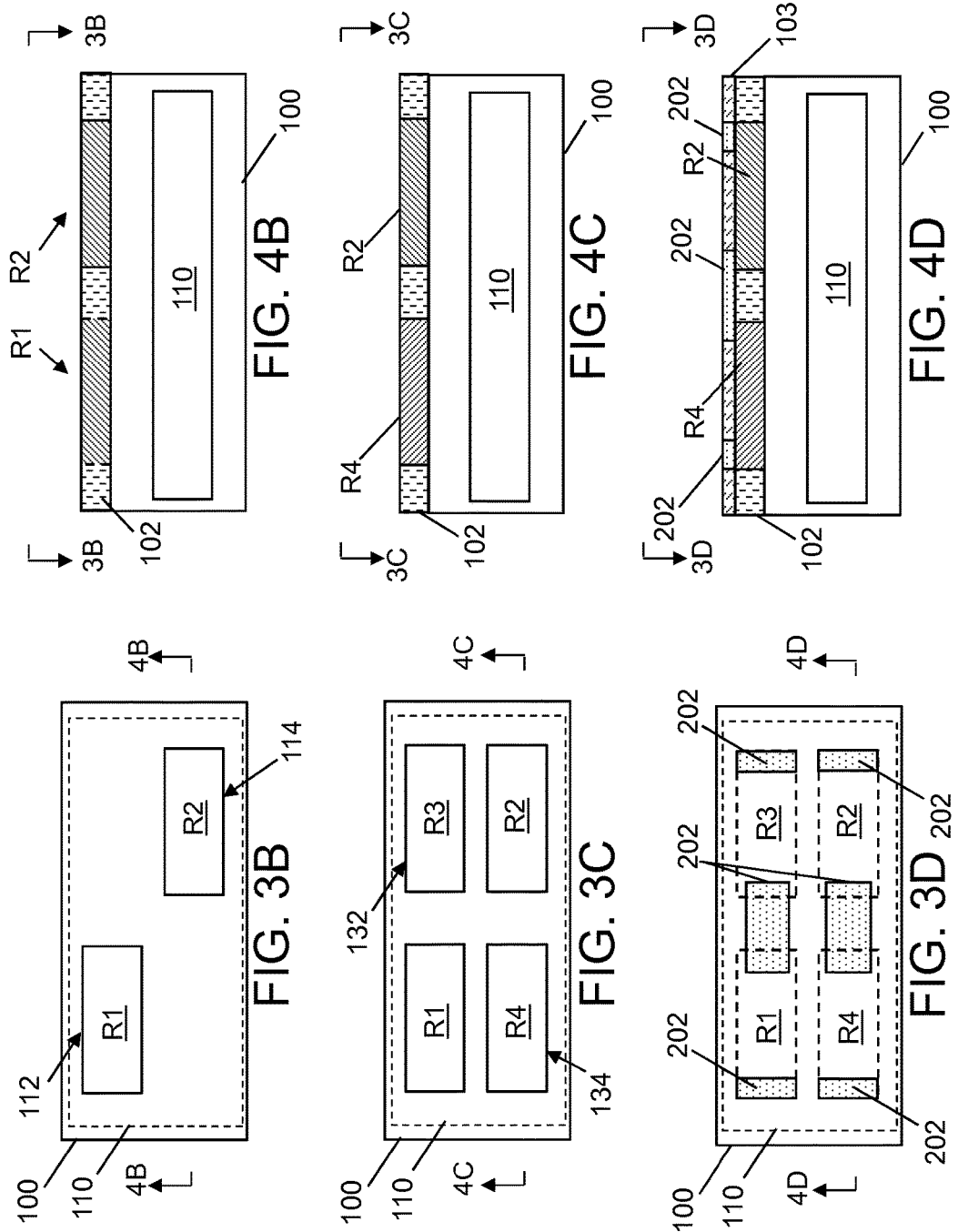

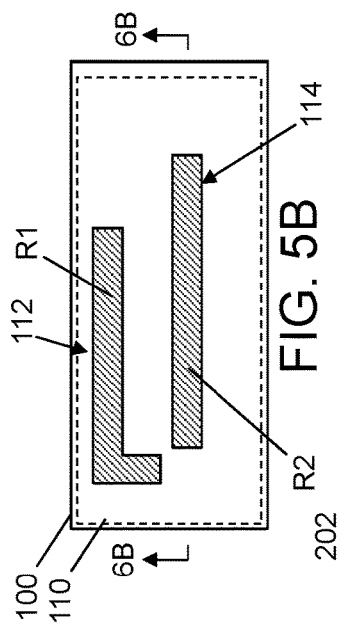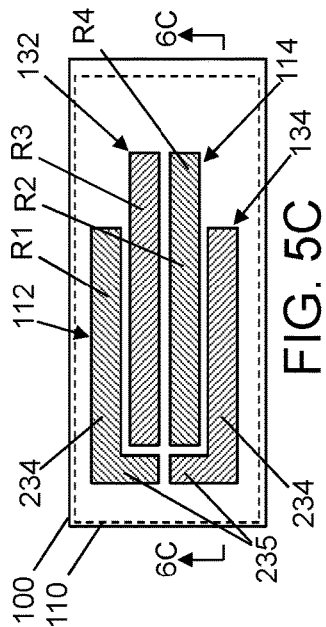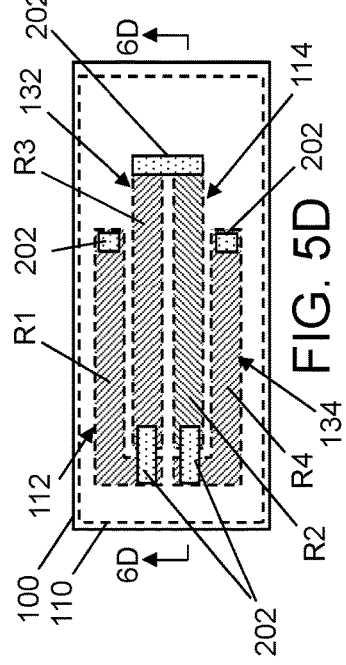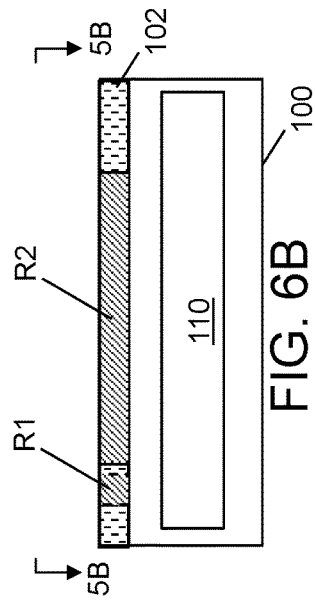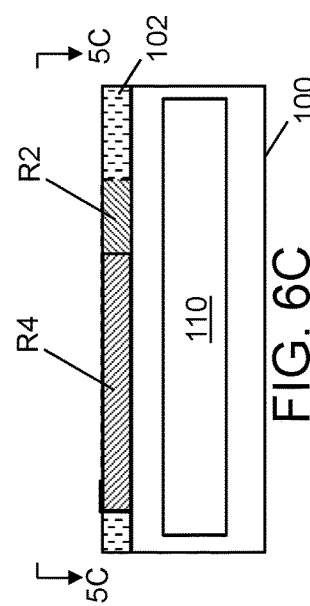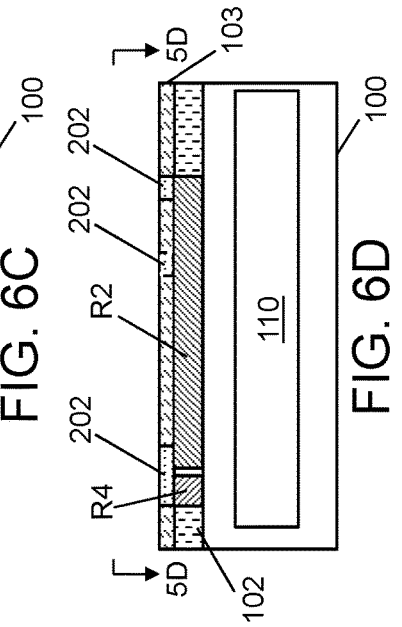

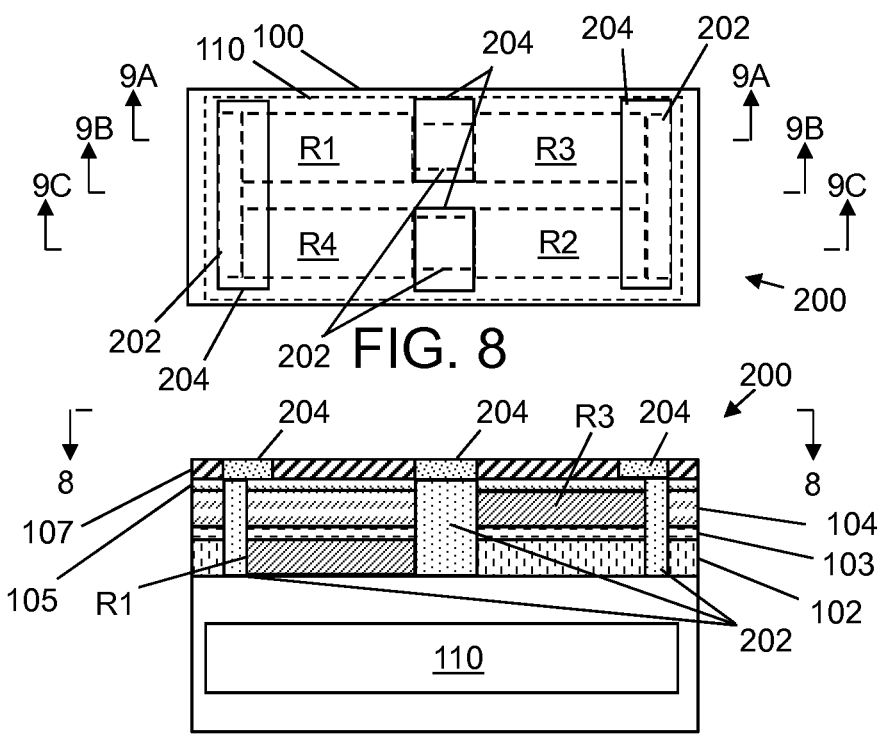
FIG. 8
FIG. 9A
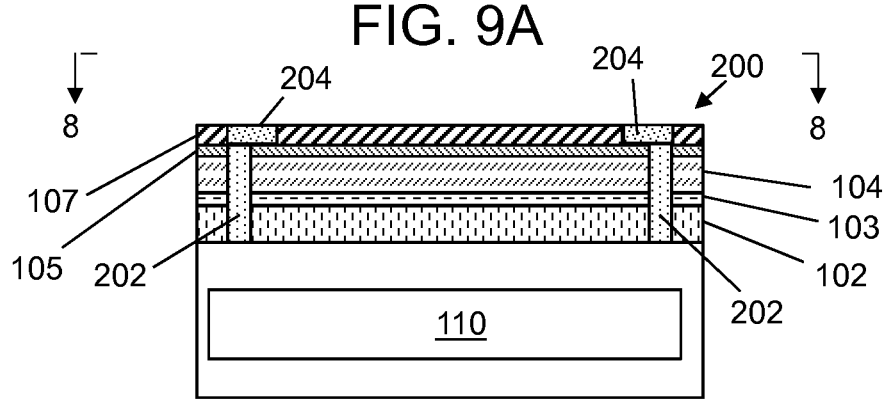
FIG. 9B
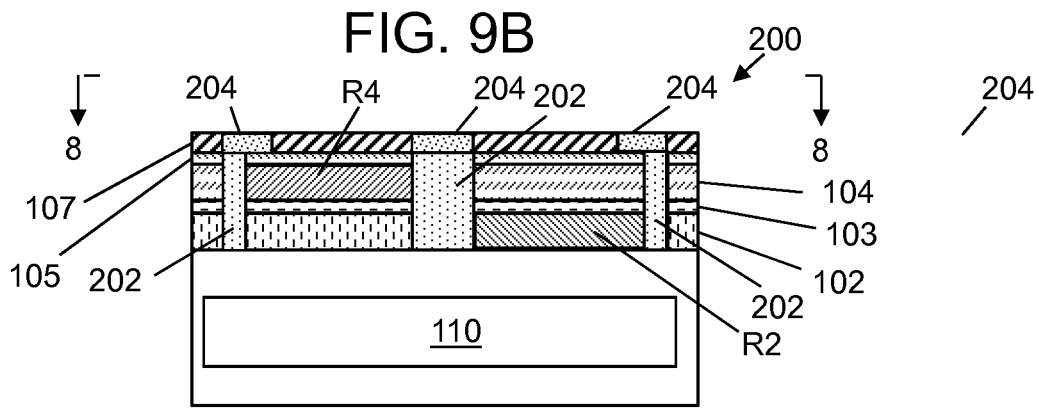
FIG. 9C

THERMORESISTANCE SENSOR STRUCTURE FOR INTEGRATED CIRCUITS AND METHOD OF MAKING

BACKGROUND

The present invention relates to microfabrication of semiconductor devices, and, more specifically, to structures and fabrication methods of thermoresistance sensors.

Precise, local measurement of temperature in an integrated circuit (IC) is typically viewed as an important factor in IC operation. Traditional solutions employ junction bandgap references in, for example, diodes and/or bipolar junction transistors (BJTs) to measure temperature. However, these may require extensive calibration to achieve a one degree Celsius resolution. In addition, silicon-on-insulator (SOI) lateral diodes and/or BJTs can be expensive to engineer. Because lateral diodes use 1D junctions, they require a relatively large area, and BJTs are difficult to manufacture since source/drain formation is now typically done in-situ with epitaxial growth techniques. Further, vertical BJTs are generally not available in SOI, and, in the manufacture of finFETs, a lower volume of silicon is typically available, which can increase difficulty in forming a suitable bandgap. Fin-based technologies pose a challenge when making planar devices, such as due to chemical mechanical polishing (CMP) and/or point of contact/connection (POC) issues.

An option that can be relatively easily and inexpensively included in most semiconductor manufacturing techniques is to employ high precision, thermally sensitive resistors. However, front-end silicon-based resistors typically have low sensitivity because other components are also responsive to temperature variations. As a result, thermal spreads can be large, which can swamp thermoresistance effects. In addition, back-end metal-based resistors are often isolated and/or far from dies, and so are affected by the overall temperature of the chip with which it is associated. Further, back-end metal-based resistors can be difficult to calibrate.

SUMMARY

According to one embodiment of the present invention, a thermoresistance sensor structure for an integrated circuit including a first layer of material of an integrated circuit and first and second front-end-of-line resistors made from a first resistor material. The first resistor material can include a first material of the first layer and can have a first thermal coefficient of resistance (TCR), and the first and second resistors can have respective first and second resistance values at a reference temperature. Third and fourth resistors can be made from a second resistor material, which can include one of the first material of the first layer or a second material of a second layer of the integrated circuit. The second resistor material can have a second TCR that differs from the first TCR by a predetermined TCR difference, and the third and fourth resistors can have respective second and fourth resistance values at the reference temperature. Metal wires from a first metallization (M1) layer of the integrated circuit can form a Wheatstone bridge by connecting the first and fourth resistors in series as part of a first leg of the bridge, and connecting the second and third resistors in series as part of a second leg of the bridge. The first and second resistors can be opposed, the third and fourth resistors can be opposed, and an output voltage of the Wheatstone bridge can be a predefined value at the reference temperature. The output voltage can be indicative of a difference in temperature between a current temperature of the bridge and the reference temperature according to a predefined relationship between at least the first TCR, the second TCR, the first, second, third, and fourth resistance values, and the difference in temperature.

Another embodiment of the invention disclosed herein includes a method of fabricating a thermoresistance sensor structure for an integrated circuit. First and second resistance areas can be defined in a first layer of the integrated circuit, such as by using shallow trench isolation (STI). The first layer can include a first material, which can in turn include a first semiconductor. First and second resistors can be formed in the first and second resistance areas using a first resistor material that can include the first material. The first resistor material can have a first thermal coefficient of resistance (TCR), and the first and second resistors can have respective first and second resistance values at a reference temperature. Third and fourth resistors of a second resistor material can be formed in one of the first material or a second material of a second layer of the integrated circuit. The second resistor material can include the one of the first material or the second resistor material can have a second TCR that differs from the first TCR by a predetermined TCR difference, and the third and fourth resistors can have respective third and fourth resistance values at the reference temperature. Contacts can be formed on the first, second, third, and fourth resistors, and the contacts of the first, second, third, and fourth resistors can be wired, using a back-end-of-line (BEOL) first metal (M1) layer, to form a Wheatstone bridge with the first and fourth resistors in a first leg, the third and second resistors in a second leg, the first and second resistors opposed, and the third and fourth resistors opposed. An output voltage of the Wheatstone bridge can be indicative of a difference in temperature between a current temperature of the first, second, third, and fourth resistors and the reference temperature according to a predefined relationship between at least the first TCR, the second TCR, the first, second, third, and fourth resistance values, and the difference in temperature.

An additional embodiment of the invention disclosed herein can take the form of a thermoresistance based temperature sensor for an integrated circuit (IC) in which a first layer of an integrated circuit (IC) can include a first material and a second layer of the IC can include a second material. A first front-end-of-line (FEOL) resistor can be formed in the first layer, the first FEOL resistor having a first resistance value at a reference temperature and a first thermal coefficient of resistance (TCR). A second FEOL resistor can also be formed in the first layer, the second FEOL resistor having substantially the first resistance value at the reference temperature and a second TCR, the first TCR and the second TCR differing by a predetermined TCR difference. A third resistor can be made from a second material of one of the first layer or the second layer, and a fourth resistor can also be made from the second material, the third and fourth resistors having substantially the first resistance value at the reference temperature. Metal wires from a first metallization (M1) layer of the integrated circuit can connect the first, second, third, and fourth resistors to form a Wheatstone bridge above a component of the IC to be monitored. The first FEOL resistor and the fourth resistor can be in a first leg of the Wheatstone bridge, and the second FEOL resistor and the third resistor can be in a second leg of the Wheatstone bridge, such that the first and second resistors are opposed and the third and fourth resistors are opposed.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE SEVERAL VIEWS OF THE DRAWINGS

The subject matter which is regarded as the invention is particularly pointed out and distinctly claimed in the claims at the conclusion of the specification. The foregoing and other features, and advantages of the invention are apparent from the following detailed description taken in conjunction with the accompanying drawings in which:

FIGS. 3A-3D are schematic plan views of a thermoresistance-based temperature sensor according to an embodiment of the invention disclosed herein and showing stages of fabrication thereof.

FIGS. 4A-4D are schematic cross-sectional illustrations of the thermoresistance-based temperature sensor shown and taken from respective view lines in FIGS. 3A-3D according to an embodiment of the invention disclosed herein and showing stages of fabrication thereof.

FIGS. 5A-5D are schematic plan views of a thermoresistance-based temperature sensor according to an embodiment of the invention disclosed herein and showing stages of fabrication thereof.

FIGS. 6A-6D are schematic cross-sectional illustrations of the thermoresistance-based temperature sensor shown and taken from respective view lines in FIGS. 5A-5D according to an embodiment of the invention disclosed herein and showing stages of fabrication thereof.

FIGS. 8 and 10A-10D are schematic plan views of a thermoresistance-based temperature sensor according to an embodiment of the invention disclosed herein and showing stages of fabrication thereof.

FIGS. 9A-9C are schematic cross-sectional illustrations of the thermoresistance-based temperature sensor shown and taken from respective view lines in FIG. 8 according to an embodiment of the invention disclosed herein and showing stages of fabrication thereof.

DETAILED DESCRIPTION

Figure 1:
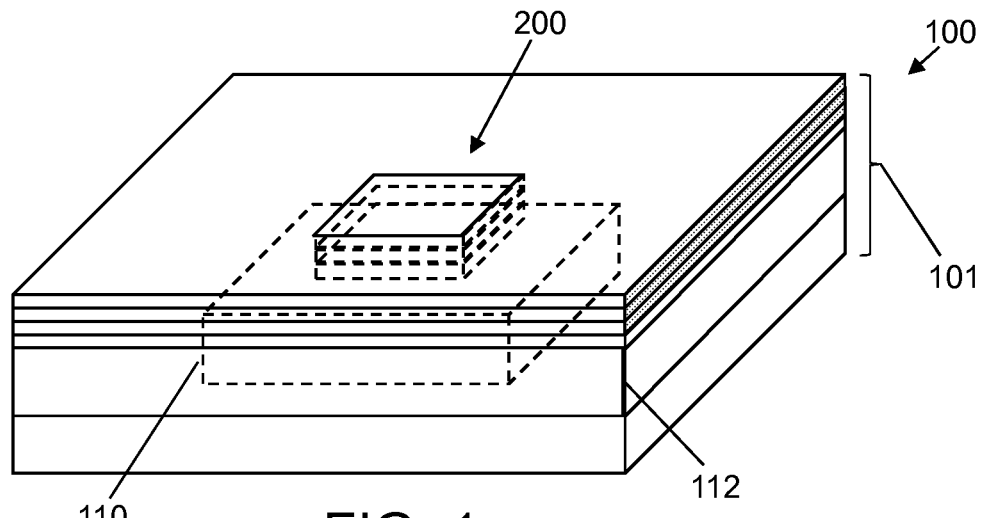
FIG. 1 is a schematic illustration of an implementation of a thermoresistance-based temperature sensor according to an embodiment of the invention disclosed herein.

Embodiments of the invention disclosed herein provide a more accurate, lower-cost thermoresistance-based temperature sensor that may be formed on a substrate, such as a semiconductor substrate or an insulative substrate, primarily with front end of line (FEOL) processes. Embodiments take advantage of materials having different thermal coefficients of resistance (TCR) by forming two electrically parallel resistors in proximity to, such as over, a component to be monitored, one resistor having a first TCR, and the other having a second, different TCR. A full Wheatstone bridge configuration can be employed as at least part of the sensor, the bridge including first, second, third, and fourth resistors in parallel first and second legs. In embodiments, the first and second resistors can be formed from a first material, such as a doped semiconductor, in a first layer of an integrated circuit, and the third and fourth resistors can be formed from a second material in/on the first layer or a second layer of the integrated circuit. The resistors can be connected using a metal layer so that the first leg includes the first and fourth resistors, the second leg of the bridge includes the third and second resistors (order of connection in the second leg in embodiments), the first and second resistors are opposed, and the third and fourth resistors are opposed. The third and fourth resistors can include additional doped semiconductor elements in either the first or second layer in embodiments, but can also include portions of a middle-of-line (MOL) metal layer. In embodiments, the MOL metal layer is added to a fabrication process specifically to form the third and fourth resistors and can include a metal layer deposited prior to a first back-end-of-line (BEOL) material layer.

Whether the third and fourth resistors are in the first or second layer, and whether they are made from doped semiconductor or MOL metal, a difference between the TCRs, that is, a predefined TCR difference, can be used to determine a current temperature of the bridge. With proper selection of TCRs, very accurate measurements of temperature can be made with such a bridge. Embodiments can use materials with as different TCRs as can be achieved, though this difference can be less where suitable and/or desired and/or necessary. Embodiments can employ materials with TCRs of opposite sense, so that while one material has an increase in resistance with an increase in temperature, the other material has a decrease in resistance, which may increase sensitivity and/or accuracy of the sensor. The sensor can then be used to determine its temperature based on the resistances of the resistors and the predetermined difference in TCRs. Examples of materials that may be suitable in embodiments are included in TABLE 1, as well as TCR for each material and, where appropriate, dopant type and concentration.

For example, a relationship that can be employed to determine temperature of the sensor can include $$V_{out} = V_{in} \cdot \left[ \left( \frac{R_{40}(1 + TCR_3 \cdot \Delta T)}{R_{10}(1 + TCR_1 \cdot \Delta T)} + 1 \right)^{-1} - \left( \frac{R_{20}(1 + TCR_1 \cdot \Delta T)}{R_{30}(1 + TCR_3 \cdot \Delta T)} + 1 \right)^{-1} \right] \quad (1)$$

were $V_{out}$ is the output voltage of the bridge, $V_{in}$ is an input or bias voltage, $TCR_1$ is a TCR of the first pair of resistors. $TCR_3$ is a TCR of the second pair of resistors, $R_{10}$, $R_{20}$, $R_{30}$, and $R_{40}$ are reference resistance values of the four resistors, such as a resistance at a reference temperature, and $\Delta T$ is a difference in temperature between a current temperature and the reference temperature.

More particularly, with reference to FIG. 1, an integrated circuit (IC) 100 can include a plurality of layers 101 and a component 110 whose temperature is to be monitored. Component 110 can be, for example, in a component layer 112, and can be part or all of IC 100, though other components can be monitored within the scope of embodiments, and IC 100 could be any other semiconductor device including a component 110 to be monitored. A sensor 200, such as a thermoresistance sensor structure in accordance with embodiments of the invention, can be formed over component 110 so that a temperature of component 110 can be monitored. It should be noted that while sensor 200 is shown as being over component 110, embodiments could place sensor 200 elsewhere, such as under and/or adjacent component 110, and can be formed independently of IC 100 in other embodiments, so long as such placement does not undesirably degrade performance of sensor 200.

Figure 2:
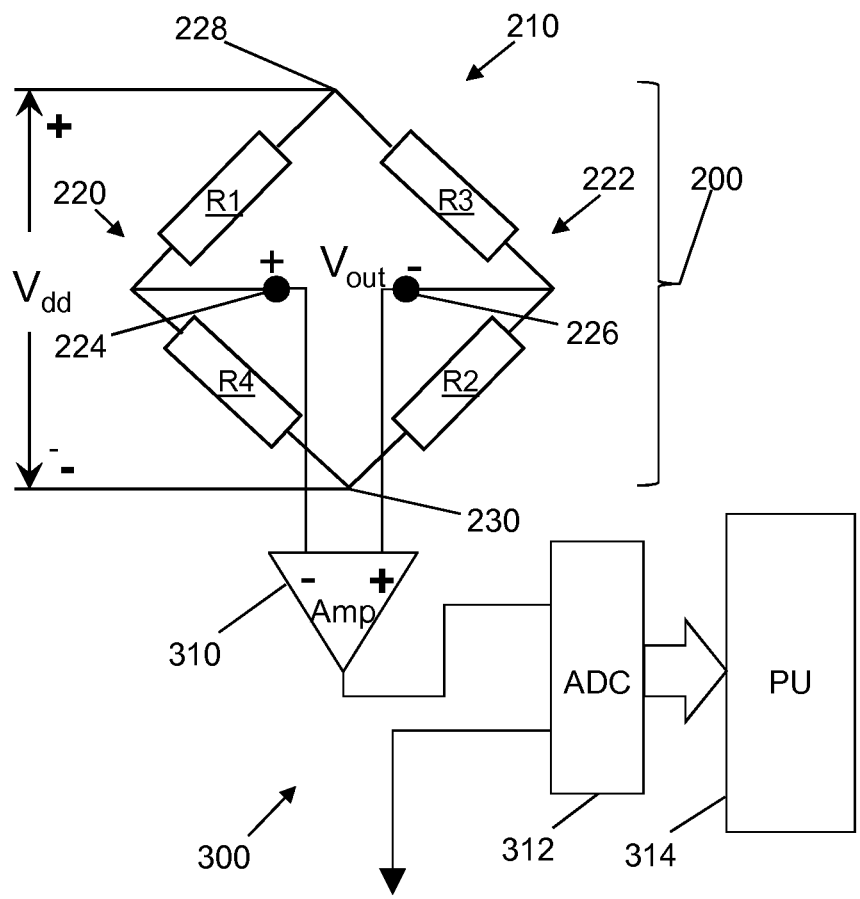
FIG. 2 is a schematic illustration of a digital temperature monitoring system including a thermoresistance-based temperature sensor according to an embodiment of the invention disclosed herein.

As can be seen in FIG. 2, sensor 200 can include a bridge 210, such as a Wheatstone bridge including first, second, third, and fourth resistors R1, R2, R3, R4 in electrically parallel first and second legs 220, 222, as well as output terminals 224, 226. A first bias terminal 228 of bridge 210 can be connected to an input voltage source 120, such as $V_{dd}$ of IC 100, and a second bias terminal 230 can be connected to a current sink. Output terminals 224, 226 can be used to form a DTM system 300, which can include a preamplifier (Amp) 310, an analog-to-digital converter (ADC) 312, and a processing unit (PU) 314. In embodiments, sensor 200 can be construed as part of DTM system 300.

In the following description, various components will be described in various stages of fabrication of sensor 200, and it is well within the purview of one of ordinary skill in the semiconductor manufacturing arts to choose appropriate techniques and/or processes for the fabrication of the various components and to achieve intermediate states between the various stages shown and described. Examples of semiconductor fabrication techniques that can be employed in various stages include shallow trench isolation (STI), deposition processes, such as, for example, physical vapor deposition (PVD), chemical vapor deposition (CVD), electrochemical deposition (ECD), molecular beam epitaxy (MBE), and atomic layer deposition (ALD); removal processes, such as, for example, wet etching, dry etching, and chemical-mechanical planarization (CMP); patterning/lithography, such as photomasking, exposing, and/or ashing; and/or electrical property modification, such as by doping by diffusion, ion implantation, dielectric constant reduction via ultraviolet light exposure, and/or annealing. U.S. Pat. No. 7,659,176 to Coolbaugh et al., issued 9 Feb. 2010, discloses using such techniques to form resistors of desired TCR, as well as materials suitable for such resistors, and is incorporated by reference in its entirety.

Figure 3A:
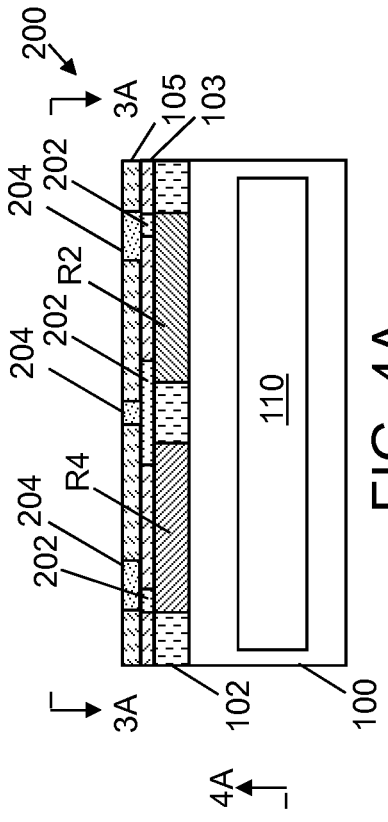
Figure 4A:
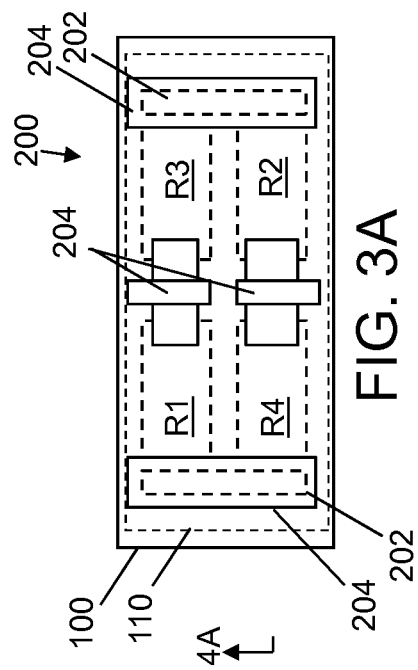

With reference to FIG. 3A and corresponding FIG. 4A, a first example of thermoresistance sensor 200 for IC 100 can include first and second resistors R1, R2 made from a first resistor material in a first layer 102 of IC 100. In embodiments, first layer 102 can include a first material, such as a semiconductor, from which first and second resistors R1, R2 can be formed, particularly as front-end-of-line (FEOL) resistors. For example, first layer 102 can include a form of silicon or another suitable semiconductor, and first and second resistors R1, R2 can be formed by doping respective first and second resistance areas 112, 114 in first layer 102 with a first dopant or impurity. The first resistor material, whether created by doping or other techniques, can have a first thermal coefficient of resistance (TCR), and first and second resistors R1, R2 can have respective first and second resistance values at a reference temperature.

Sensor 200 can also include third and fourth resistors R3, R4 made from a second resistor material that can include the first material of first layer 102 or a second material of a second layer 104 of the IC. In embodiments, the second resistor material can have a second TCR that differs from the first TCR by a predetermined TCR difference. For example, third and fourth resistors R3, R4 can be formed by doping third and fourth resistance areas 122, 124 in first layer 102 using a second dopant or impurity at a second concentration. The second dopant or impurity can be the same as the first dopant or impurity, in which case the second concentration must be different from the first concentration so that the second TCR can be different from the first TCR. Alternatively, the second dopant or impurity can be a different dopant or impurity and the second concentration can be selected so that the second TCR differs from the first TCR. The third and fourth resistors R3, R4 can have respective third and fourth resistance values at the reference temperature.

First, second, third, and fourth resistors R1, R2, R3, R4 can be connected to form bridge 210 (FIG. 2) with contacts 202 at ends of the resistors, metal wire(s) 204 connecting first and fourth resistors R1, R4 in series, connecting second and third resistors R2, R3 in series, connecting first and third resistors R1, R3, and connecting the second and fourth resistors (R2, R4). Thus connected, with additional reference to FIG. 2, first and fourth resistors R1, R4 can be part of first leg 220 of bridge 210, and second and third resistors R2, R3 can be part of a second leg 222 of bridge 210, with first and second resistors R1, R2 opposed and third and fourth resistors R3, R4 opposed. Metal wires 204 can also serve as part of and/or include respective output terminals 224, 226 and bias terminals 228, 230. In embodiments, one or more of metal wires 204 can be made from a first metallization (M1) layer of IC 100. It should be understood that, while a first metallization (M1) layer has been provided as an example of a layer to be used for metal wires and/or interconnects, any suitable 1×BEOL metallization layer Mn can be employed as may be desired and/or appropriate.

So connected, sensor 200 can have an output voltage including an output voltage of bridge 210 across output terminals 224, 226 that can have a predefined value at the reference temperature. The output voltage of sensor 200 can be indicative of a difference in temperature between a current temperature of the bridge and the reference temperature according to a predefined relationship between at least the first TCR, the second TCR, the first, second, third, and fourth resistance values, and the difference in temperature. In embodiments, resistance values of all four resistors R1, R2, R3, R4 can be substantially identical, opposed pairs of resistors can have substantially identical resistance values in embodiments so that R1=R2 and R3=R4, and/or any other suitable combination of resistance values can be employed.

Figure 5A:
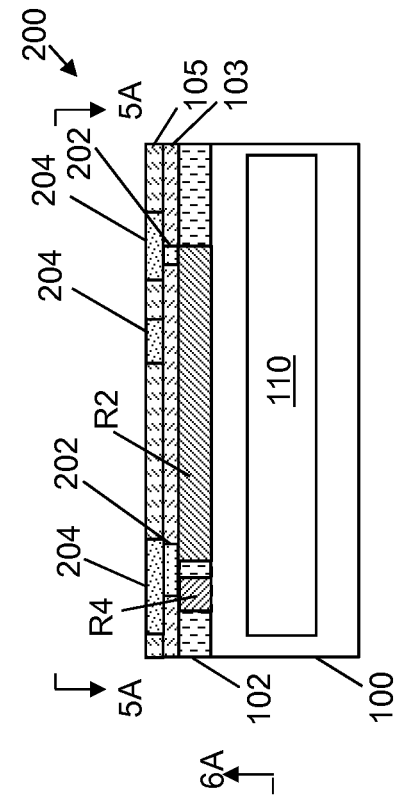
Figure 6A:
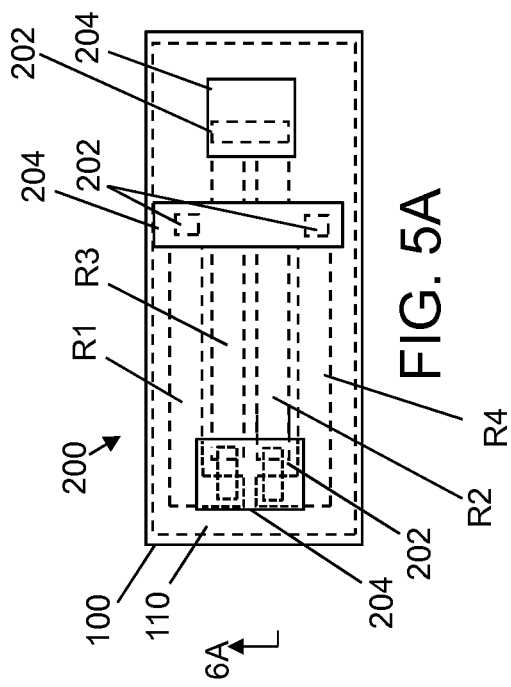

Another example of a thermoresistance based temperature sensor 200 according to embodiments of the invention disclosed herein is seen in FIGS. 5A and 6A. Like the example of FIGS. 3A and 4A, resistors R1, R2, R3, R4 can be wired into a bridge with contacts 202 and metal wires 204, but the components can be arranged and/or made differently, which can facilitate fabrication in some circumstances. In particular, with reference to FIG. 5C showing an intermediate stage of formation of sensor 200 as will be described below, second and third resistors R2, R3 can be adjacent, substantially parallel, and of substantially identical dimension as compared to each other. This in and of itself is similar to the example of FIGS. 3A and 4A, but in the example of FIGS. 5A and 6A, first and fourth resistors R1, R4 can each include respective first and second portions 233, 235, one of which can be substantially parallel to second and third resistors R2, R3, and the other of which can be substantially perpendicular to second and third resistors R2, R3. In the example shown, first and fourth resistors R1, R4 are substantially L-shaped, with their first portions 233 being parallel to second and third resistors R2, R3 and their second portions 235 being substantially perpendicular to second and third resistors R2, R3. In this example, first sections 233 are longer than second sections 235, but whatever the relative lengths of first and second sections 233, 235, the total length of first resistor R1, second resistor R2, third resistor R3, and/or fourth resistor R4 can be substantially identical. In addition, it should be apparent that while an L-shape is offered in this example, any shape can be used for any of first, second, third, and/or fourth resistors R1, R2, R3, R4 so long as total length and/or resistance requirements are met. In embodiments, as in the example of FIGS. 3A and 4A, resistance values of all four resistors R1, R2, R3, R4 can be substantially identical, opposed pairs of resistors can have substantially identical resistance values in embodiments so that R1=R2 and R3=R4, and/or any other suitable combination of resistance values can be employed.

Turning now to FIGS. 3B-3D and 4B-C, intermediate stages of the first example of sensor 200 shown in FIGS. 3A and 4A are illustrated. A first intermediate stage shown in FIGS. 3B and 4B can include first and second resistance areas 112, 114 and/or first and second resistors R1, R2 formed on or in first layer 102, such as over component 110 to be measured. With reference to FIGS. 3C and 4C, a second intermediate stage can include third and fourth resistance areas 132, 134 and/or third and fourth resistors R3, R4. In this example, surfaces of resistors R1, R2, R3, R4 can be flush with a top surface of first layer 102, which can be achieved by known semiconductor manufacturing techniques. As seen in FIGS. 3D and 4D, a third intermediate stage can include contacts 202 on ends of resistors R1, R2, R3, R4, which can be formed at least in part in an intermediate layer 103 as shown in FIGS. 3A and 4A, such as an interlevel dielectric layer (ILD). Contacts 202 can be made flush with a top surface of intermediate layer 103 by any suitable semiconductor fabrication technique prior to deposit of a metallization layer to form metal wires 204, such as in another intermediate layer 105 (FIG. 4A), which can also be an ILD. After formation and/or deposit of metal wires 204, additional layers and/or devices and/or components can be formed above sensor 200 as may be suitable and/or desired. It should be noted that etch stop layers and/or liners can be included as may be deemed necessary and/or suitable.

Turning now to FIGS. 5B-5D and 6B-6C, intermediate stages of the second example of sensor 200 shown in FIGS. 5A and 6A are illustrated. Much as in the first example, a first intermediate stage shown in FIGS. 5B and 6B can include first and second resistance areas 112, 114 and/or first and second resistors R1, R2 formed on or in first layer 102, such as over component 110 to be measured. In a second intermediate stage, shown in FIGS. 5C and 6C, third and fourth resistance areas 132, 134 and/or third and fourth resistors R3, R4 can be included, and top surfaces of resistors R1, R2, R3, R4 can be flush with a top surface of first layer 102, which can be achieved by known semiconductor manufacturing techniques. As seen in FIGS. 5D and 6D, a third intermediate stage can include contacts 202 on ends of resistors R1, R2, R3, R4, which can be formed in an intermediate layer 103 as shown in FIGS. 5A and 6A, such as an ILD layer. Contacts 202 can be made flush with a top surface of intermediate layer 103 by any suitable semiconductor fabrication technique prior to deposit of a metallization layer to form metal wires 204, such as in another intermediate layer 105 (FIG. 6A), which can be an ILD layer. After formation and/or deposit of metal wires 204, additional layers and/or devices and/or components can be formed above sensor 200 as may be suitable and/or desired.

Figure 7:
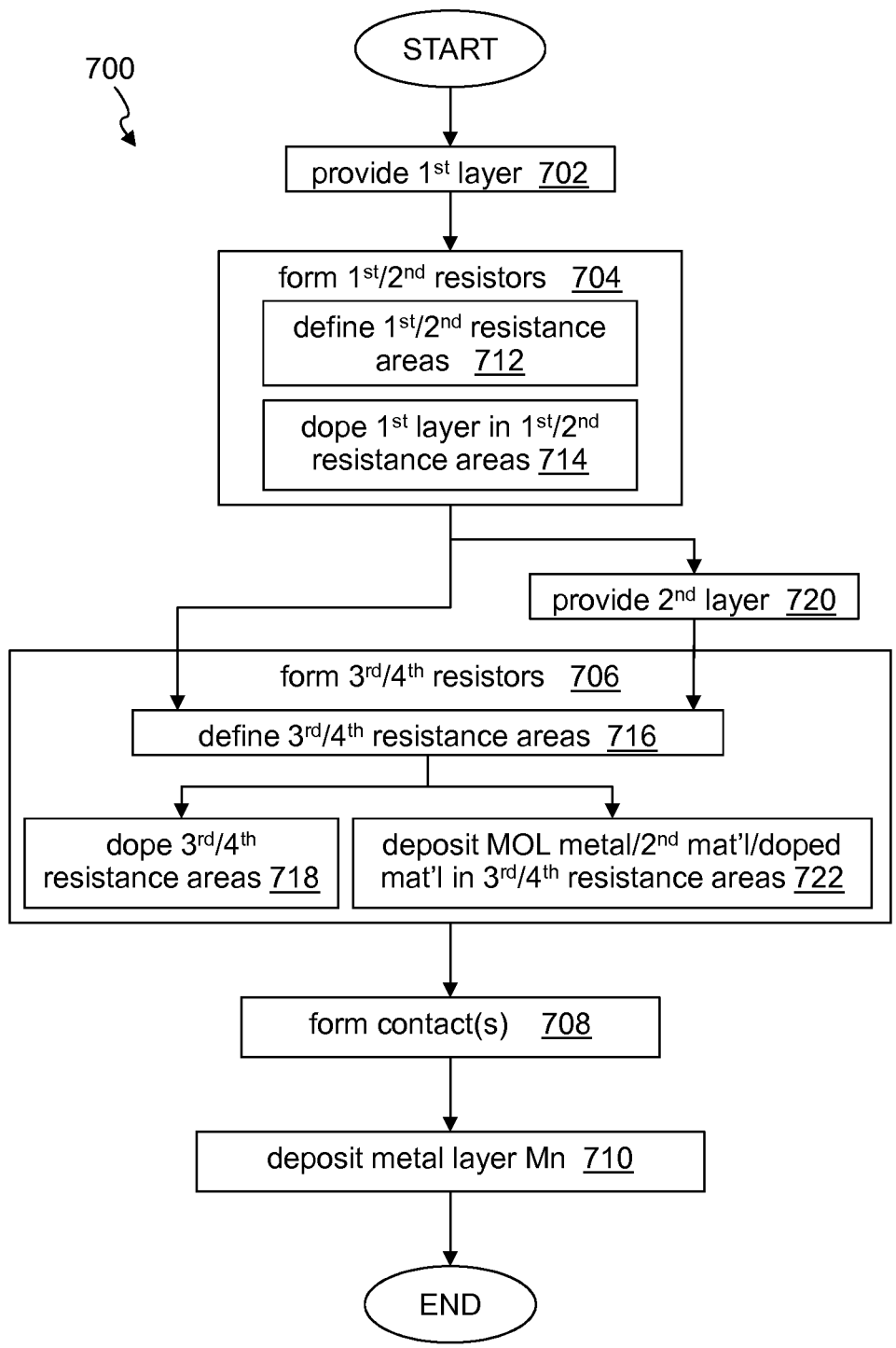
FIG. 7 is a schematic illustration of a method of fabricating a thermoresistance-based temperature sensor according to embodiments of the invention disclosed herein.
Figure 10A:
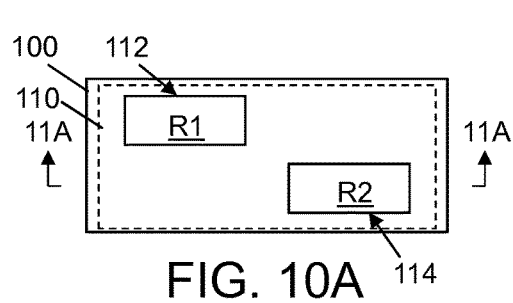
Figure 11A:
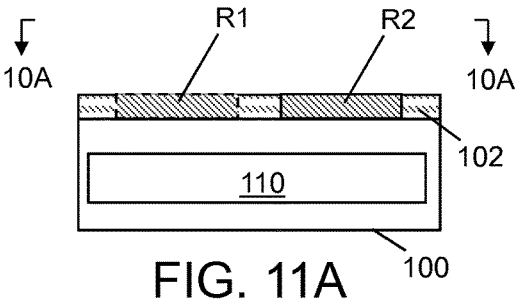
FIGS. 11A-11D are schematic cross-sectional illustrations of the thermoresistance-based temperature sensor shown and taken from respective view lines in FIGS. 10A-10D according to an embodiment of the invention disclosed herein and showing stages of fabrication thereof.
Figure 10B:
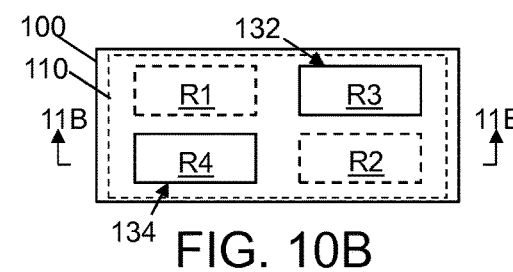
Figure 11B:
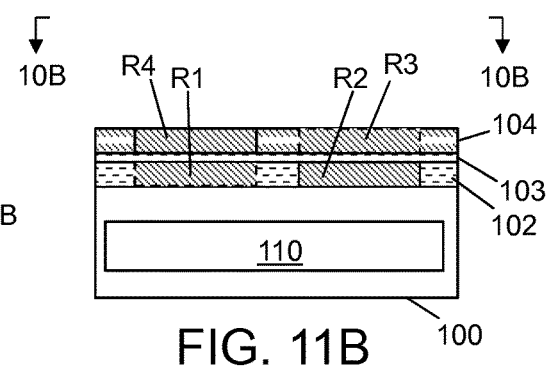
Figure 10C:
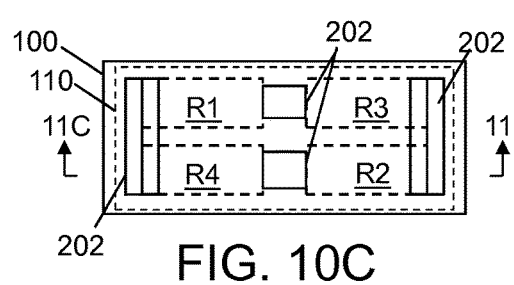
Figure 11C:
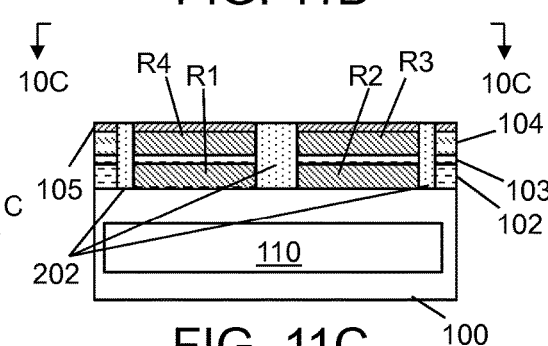
Figure 10D:
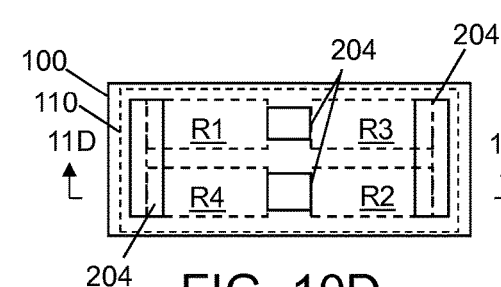
Figure 11D:
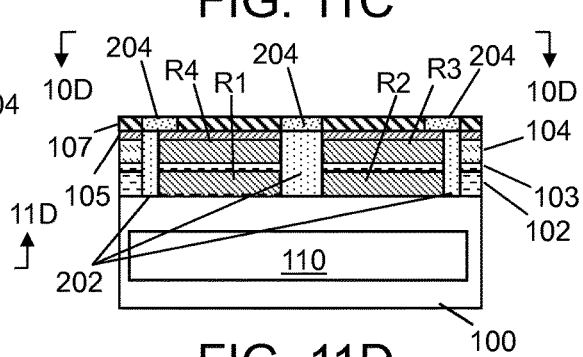

Turning now to FIG. 7, a method 700 of fabricating a thermoresistance sensor according to embodiments of the invention disclosed herein can include providing a first layer (block 702), forming first and second resistors (block 704), forming third and fourth resistors (block 706), forming contacts on the resistors (block 708), and depositing a metallization layer (block 710) to wire the resistors into a bridge, such as that shown schematically in FIG. 2. As suggested above, providing a first layer can include providing an IC that can already include the first layer, and/or providing an IC on which the first layer can be formed, though any suitable first layer could be provided. For example, the first layer could be a silicon wafer or portion thereof on/in which the sensor can be formed and later attached to a device to be monitored and/or including a component to be monitored.

As seen in FIG. 7, forming first and second resistors (block 702) can include defining first and second resistance areas (block 712). As discussed above, first and second resistance areas 112, 114, such as shown in FIGS. 3B, 4B, 5B, and 6B, can be defined in first layer 102 of IC 100 using STI, which can also electrically isolate first and second resistance areas 112, 114, though other techniques can be employed. For example, photolithography can be employed to pattern resistance areas 112, 114, and material of first layer 102 can be removed therein to form resistance areas 112, 114 as cavities in first layer 102 through known semiconductor fabrication techniques. In such embodiments, first layer 102 can be a dielectric, such as SiO2, though any other suitable dielectric can be employed.

Forming first and second resistors (bock 702) can also include doping the first layer in the first and second resistance areas (block 714). For example, referring to FIGS. 3B, 4B, 5B, and 6B, first layer 102 can include a semiconductor, such as silicon, into which a first dopant or impurity can be introduced at a first concentration within first and second resistance areas 112, 114. Some non-limiting examples of suitable dopants or impurities are listed in TABLE I, along with the TCR each dopant or impurity can yield in silicon and polysilicon at some example concentrations. It should be recognized that TABLE I may not be a listing of every dopant or impurity that could be used and/or every concentration at which they might be employed to yield respective TCRs, but with these examples, one of ordinary skill in the art can determine appropriate concentrations and/or dopants or impurities to be used in a particular implementation. By doping the material of first layer 102 within first and second resistance areas 112, 114, a first resistor material can be formed with properties determined at least in part by the first dopant or impurity and a concentration in which the first dopant and/or impurity is present in the first and/or second resistance areas 112, 114. Doping can be implemented by any suitable technique, such as ion implantation, diffusion, and/or any other technique(s) now known and/or later discovered and/or developed.

TABLE I

| Material/Dopant Species | TCR Range (Si) ppm/° C. | Concentration Range atm/cm3 |
|---|---|---|
| As in c-Si | −1000 to 3000 | $10^{17}$ to $10^{21}$ |
| P in c-Si | −1000 to 3000 | $10^{17}$ to $10^{21}$ |
| B in c-Si | −1000 to 3000 | $10^{17}$ to $10^{21}$ |
| Sb in c-Si | −1000 to 10000 | $10^{17}$ to $10^{21}$ |
| As in poly-Si | −4000 to 3000 | $10^{17}$ to $10^{21}$ |
| P in poly-Si | −4000 to 3000 | $10^{17}$ to $10^{21}$ |
| B in poly-Si | −4000 to 3000 | $10^{17}$ to $10^{21}$ |
| W, Mo, or Re | −100 to −20 | |
| WSix | −800 to −10 | |
| Al | Up to 4000 | |
| Ta, Ta$_2$N | −100 to 100 | |

In embodiments in which the first and second resistance areas are cavities, a first resistor material can be deposited into the cavities to form the first and second resistors. Examples of materials that can be used as the first resistor material are included in TABLE I, such as doped silicon, tungsten, molybdenum, rhenium, tungsten silicide, aluminum, tantalum, and/or tantalum nitride.

With continued reference to FIG. 7, forming third and fourth resistors (block 706) can include defining third and fourth resistance areas (block 716). As with the first and second resistance areas, the third and fourth resistance areas can be defined in the first layer, such as with STI, and the material of the first layer can be doped in the third and fourth resistance areas (block 718). For example, referring to FIGS. 3C, 4C, 5C, and 6C, first layer 102 can include a semiconductor, such as silicon, into which a second dopant or impurity can be introduced at a second concentration within third and fourth resistance areas 132, 134. Like the first and second resistance areas, the third and fourth resistance areas can be doped using any suitable technique and, in embodiments includes, using a second dopant in or at a second concentration can form a second resistor material in the second resistance areas. Examples of suitable dopants or impurities are listed in TABLE I as indicated above, and the second dopant or impurity and/or concentration can be selected to yield a second TCR that is different from the first TCR by a known or predefined TCR difference.

The second dopant or impurity can be the same as the first dopant or impurity, in which case the second concentration must be different from the first concentration. Where the second dopant or impurity is different from the first dopant or impurity, the first and second concentrations need not be the same and can be selected to yield a desired and/or predefined TCR difference between the first and second TCRs. In embodiments, the dopants or impurities and/or concentrations can be selected to yield as large a TCR difference as is feasible, such as to increase sensitivity of the thermoresistance-based temperature sensor. Additionally, the first TCR can be of one sign or sense, such as one of positive or negative, and the second TCR can be of an opposite sign or sense such as the other of positive or negative, which in embodiments can yield a larger TCR difference than having first and second TCRs of the same sign or sense.

Forming contacts (block 708) can include patterning and removing material from an intermediate layer, such as intermediate layer 103 shown in FIGS. 3A-6D, and depositing a contact material and/or components thereof, if appropriate and/or desired. Examples of appropriate contact materials include, but are not limited to, silicides of platinum (Pt) and/or cobalt (Co). Depositing a metallization layer Mn (block 710) can likewise include patterning and removing material from an additional intermediate layer, such as second intermediate layer 105 shown in FIGS. 3A-6D, such that the contacts are exposed, and depositing an $n^{th}$ metallization layer so that wires and/or terminals extend from the contacts to a top surface of the intermediate layer. Alternatively, forming contacts (block 708) can include forming cavities by patterning and material removal such that depositing a metallization layer (block 710) fills the cavities to connect directly to the resistors. In embodiments, the metallization layer can be the first metallization layer M1 typically employed in semiconductor device fabrication, though other layers could be used.

Rather than defining the third and fourth resistance areas in the first layer, a second layer can be provided (block 720) in embodiments, and the third and fourth resistance areas can be defined (block 716) in the material of the second layer. For example, a third example of an implementation of an embodiment of the invention disclosed herein can be seen in FIGS. 8, 9A-9C, 10A-10D, and 11A-11D and roughly corresponds to the first example at least in a plan view. The third example can include a first layer 102 in which first and second resistors R1, R2 can be formed, an intermediate layer 102, and a second layer 104 in which third and fourth resistors R3, R4 can be formed. As in the first example, the first layer can include a semiconductor material such that forming first and second resistors (block 704) can include isolation and doping of first and second resistance areas in the first layer to form a first resistor material. Defining third and fourth resistance areas (block 716) can include isolation and doping the second layer, like defining the first and second resistance areas (block 712), where second layer 104 includes a semiconductor material. Alternatively, in embodiments, defining third and fourth resistance areas (block 716) in second layer 104 can include patterning and material removal to form cavities into which second resistor material can be deposited. For example, the second resistor material can include doped semiconductor, and/or, in embodiments, a metallization layer can be added to the fabrication process such that the third and fourth resistors can be formed form a "middle-of-line" (MOL) metal, doped semiconductor, semiconductor, and/or other suitable material and/or any suitable combination thereof. Similar steps and/or techniques can be used to form third and fourth resistors in a fourth example of embodiments shown in FIGS. 12, 13A-13D, 14A-14C, and 15A-15C.

In the third and fourth examples, forming contacts (block 708) can include patterning and material removal through to the bottom of the first layer of material at ends of the resistors and depositing contact material. For example as seen in the third example of FIGS. 8-11D, particularly in FIGS. 9A-9C and 11C, a third intermediate layer 105 can be formed atop second layer 104 and can be patterned such that contacts 202 can be formed at and extend across respective opposite ends of adjacent resistor pairs as seen from plan view of FIG. 8. Thus, a contact 202 can extend across ends of first and fourth resistors R1, R4 and another contact can extend across ends of second and third resistors R2, R3, both extending from the top of IC 100 to the top of second intermediate layer 105. In addition, contacts 202 can be formed between facing ends of resistor pairs, such as, for example, between first and third resistors R1, R3 and between second and fourth resistors R2, R4, so that a contact 202 can extend between pairs of end faces and to the surface of a second intermediate layer 105. Depositing a metallization layer Mn (block 710) can include depositing a third intermediate layer 107, patterning and removing material over contacts 202, and filling the cavities with deposited metal to form wires 204. Alternatively, the cavities formed for contacts 202 can be filled with metal from metallization layer Mn directly.

Figure 12:
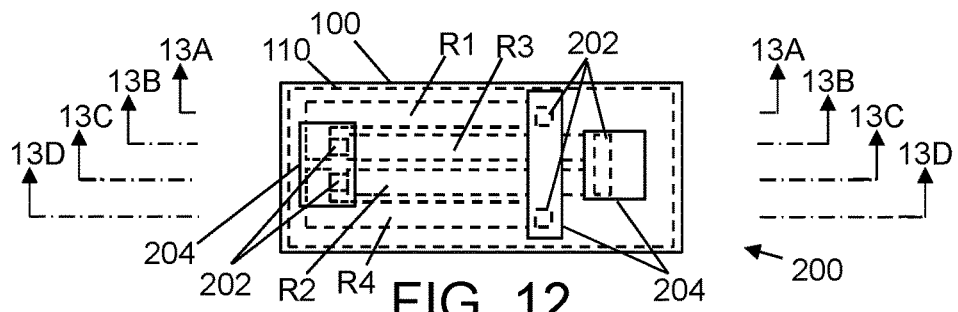
FIGS. 12 and 14A-14D are schematic plan views of a thermoresistance-based temperature sensor according to an embodiment of the invention disclosed herein and showing stages of fabrication thereof.
Figure 13A:
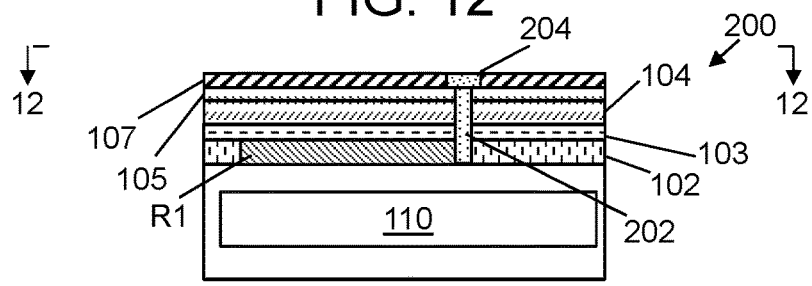
FIGS. 13A-13D are schematic cross-sectional illustrations of the thermoresistance-based temperature sensor shown and taken from respective view lines in FIG. 12 according to an embodiment of the invention disclosed herein and showing stages of fabrication thereof.
Figure 13B:
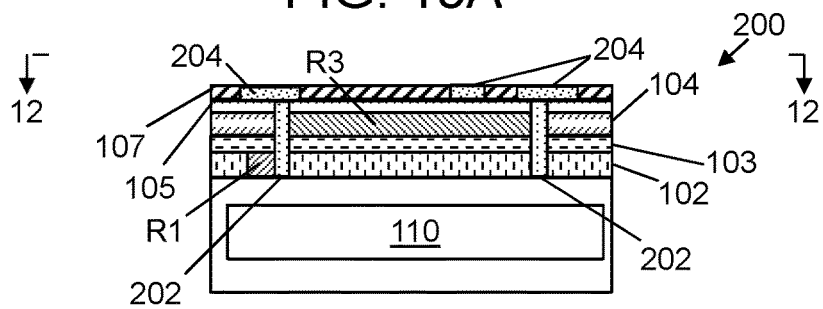
Figure 13C:
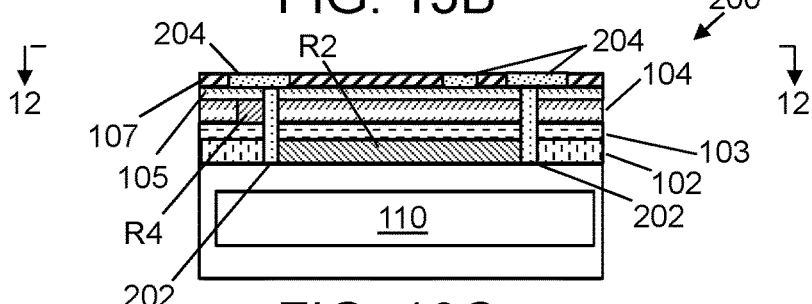
Figure 13D:
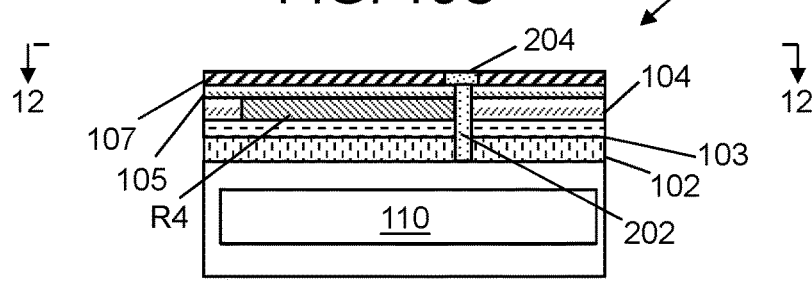
Figure 14A:
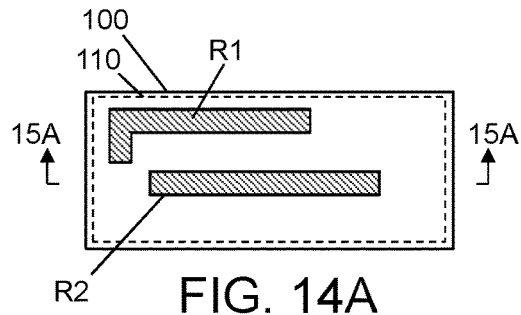
Figure 15A:
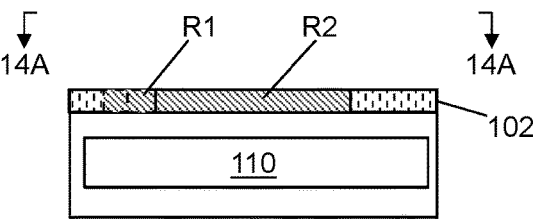
FIGS. 15A-15D are schematic cross-sectional illustrations of the thermoresistance-based temperature sensor shown and taken from respective view lines in FIGS. 10A-10D according to an embodiment of the invention disclosed herein and showing stages of fabrication thereof.
Figure 14B:
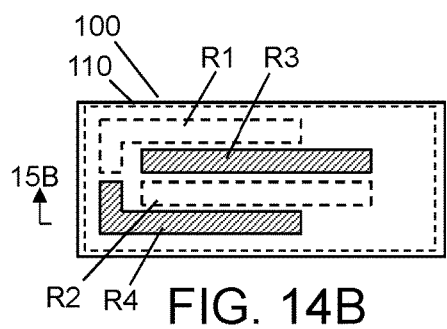
Figure 15B:
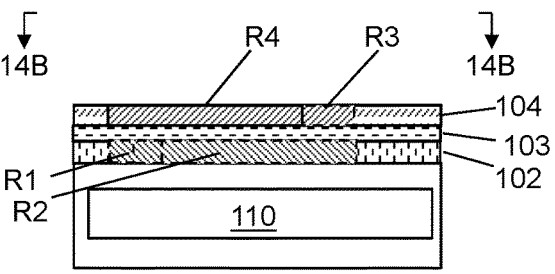
Figure 14C:
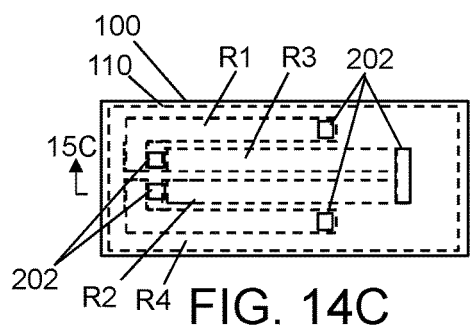
Figure 15C:
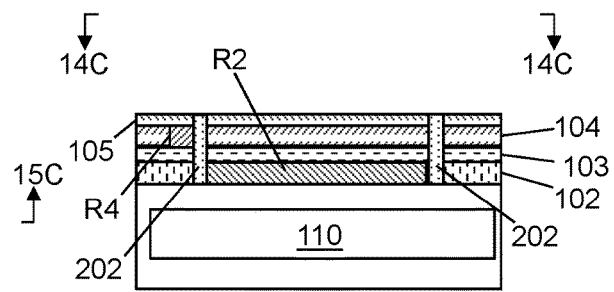
Figure 14D:
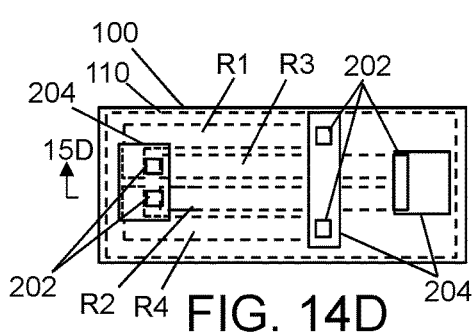
Figure 15D:
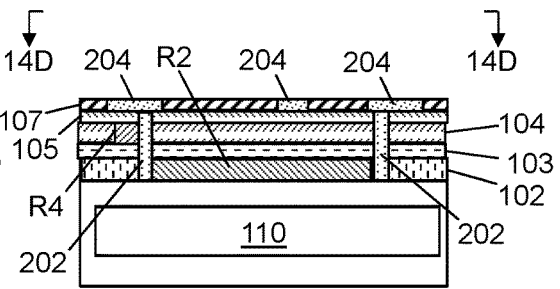

The description of forming contacts (block 708) and depositing a metallization layer Mn (block 710) can apply to the fourth example shown in FIGS. 12-15C. In the fourth example, however, due to the L-shape of first and fourth resistors R1, R4, less material can be required to form contacts 202 between the resistors R1, R2, R3, R4. For example, as seen in FIGS. 12 and 13B, a contact 202 between first and third resistors R1, R3 can include a small rectangular cross section contacting an end of a foot of first resistor R1 and an end of third resistor R3, and the same can be true of a contact 202 between an end of a foot of fourth resistor R4 and an end of second resistor R2. Similar contacts 202 can be formed at ends of legs of first and fourth resistors R1, R4, and a contact 202 between adjacent ends of second and third resistors R2, R3 as seen from plan view of FIG. 12 can be much like end contacts of the third example. Forming contacts (block 708) and depositing a metallization layer Mn (block 710) can be performed in much the same way as described with respect to the third example above with variants within the purview of one of ordinary skill in the art.

Once formed, the thermoresistance-based temperature sensor can be connected as part of a DTM as shown schematically in FIG. 2. One or more of the Amp, ADC, and CU can be formed along with and/or after and/or before the sensor, and can be part of the same overall device. Alternatively, conductor(s) can be provided that can allow connection of the sensor to an external device.

Figure 16:
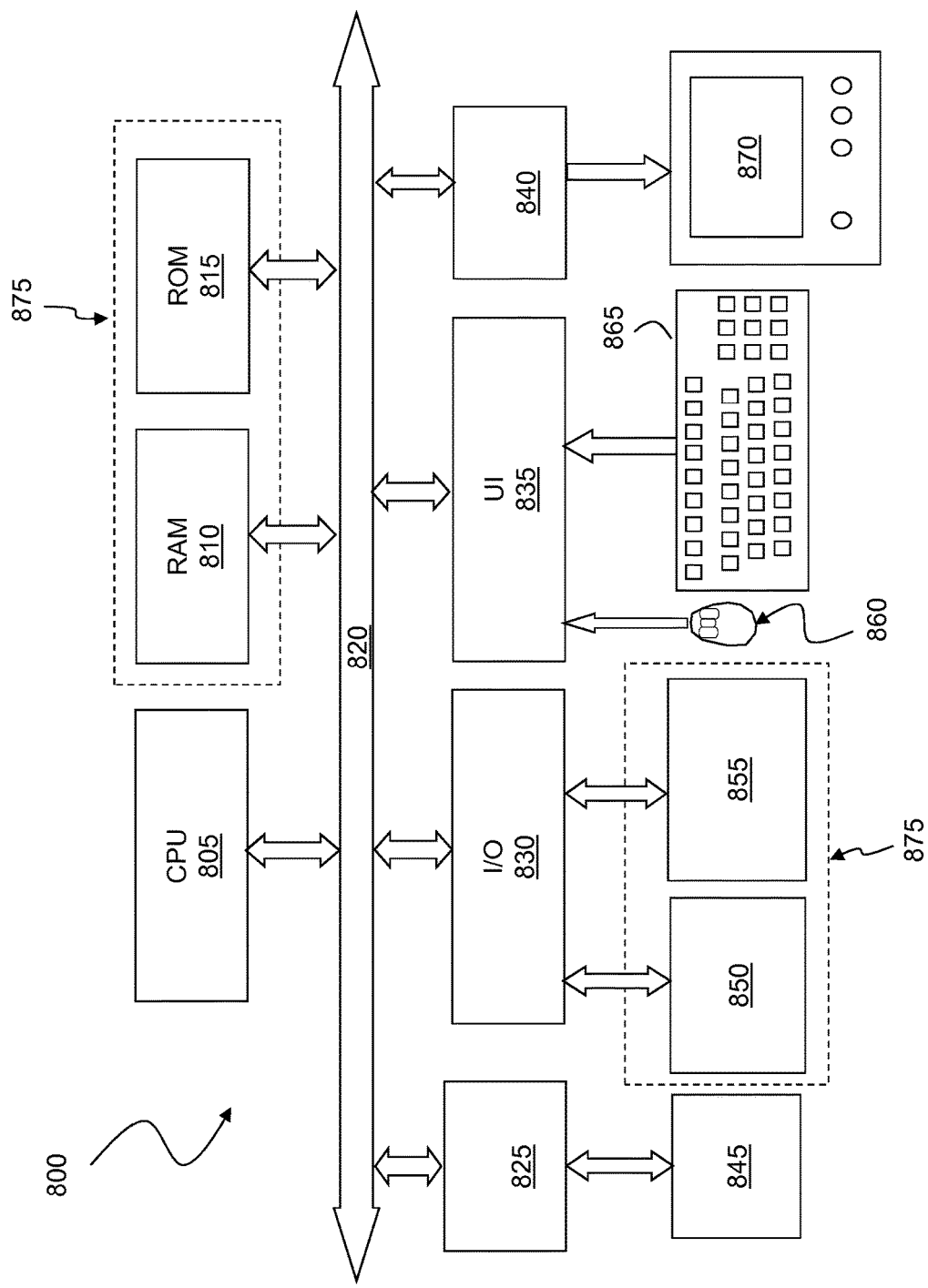
FIG. 16 is a schematic block diagram of a general purpose computer system which may be used to practice aspects of embodiments of the invention disclosed herein.

A thermoresistance-based temperature sensor according to embodiments of the invention disclosed herein may be implemented as a circuit design structure. FIG. 16 illustrates a block diagram of a general-purpose computer system which can be used to implement the circuit and circuit design structure described herein. The design structure may be coded as a set of instructions on removable or hard media for use by general-purpose computer. FIG. 16 is a schematic block diagram of a general-purpose computer for practicing the present invention. FIG. 16 shows a computer system 800, which has at least one microprocessor or central processing unit (CPU) 805. CPU 805 is interconnected via a system bus 820 to machine readable media 875, which includes, for example, a random access memory (RAM) 810, a read-only memory (ROM) 815, a removable and/or program storage device 855 and a mass data and/or program storage device 850. An input/output (I/O) adapter 830 connects mass storage device 850 and removable storage device 855 to system bus 820. A user interface 835 connects a keyboard 865 and a mouse 860 to system bus 820, and a port adapter 825 connects a data port 845 to system bus 820 and a display adapter 840 connect a display device 870. ROM 815 contains the basic operating system for computer system 800. Examples of removable data and/or program storage device 855 include magnetic media such as floppy drives, tape drives, portable flash drives, zip drives, and optical media such as CD ROM or DVD drives. Examples of mass data and/or program storage device 850 include hard disk drives and non-volatile memory such as flash memory. In addition to keyboard 865 and mouse 860, other user input devices such as trackballs, writing tablets, pressure pads, microphones, light pens and position-sensing screen displays may be connected to user interface 835. Examples of display device 870 include cathode-ray tubes (CRT) and liquid crystal displays (LCD).

A machine readable computer program may be created by one of skill in the art and stored in computer system 800 or a data and/or any one or more of machine readable medium 875 to simplify the practicing of this invention. In operation, information for the computer program created to run the present invention is loaded on the appropriate removable data and/or program storage device 855, fed through data port 845 or entered using keyboard 865. A user controls the program by manipulating functions performed by the computer program and providing other data inputs via any of the above mentioned data input means. Display device 870 provides a means for the user to accurately control the computer program and perform the desired tasks described herein.

Figure 17:
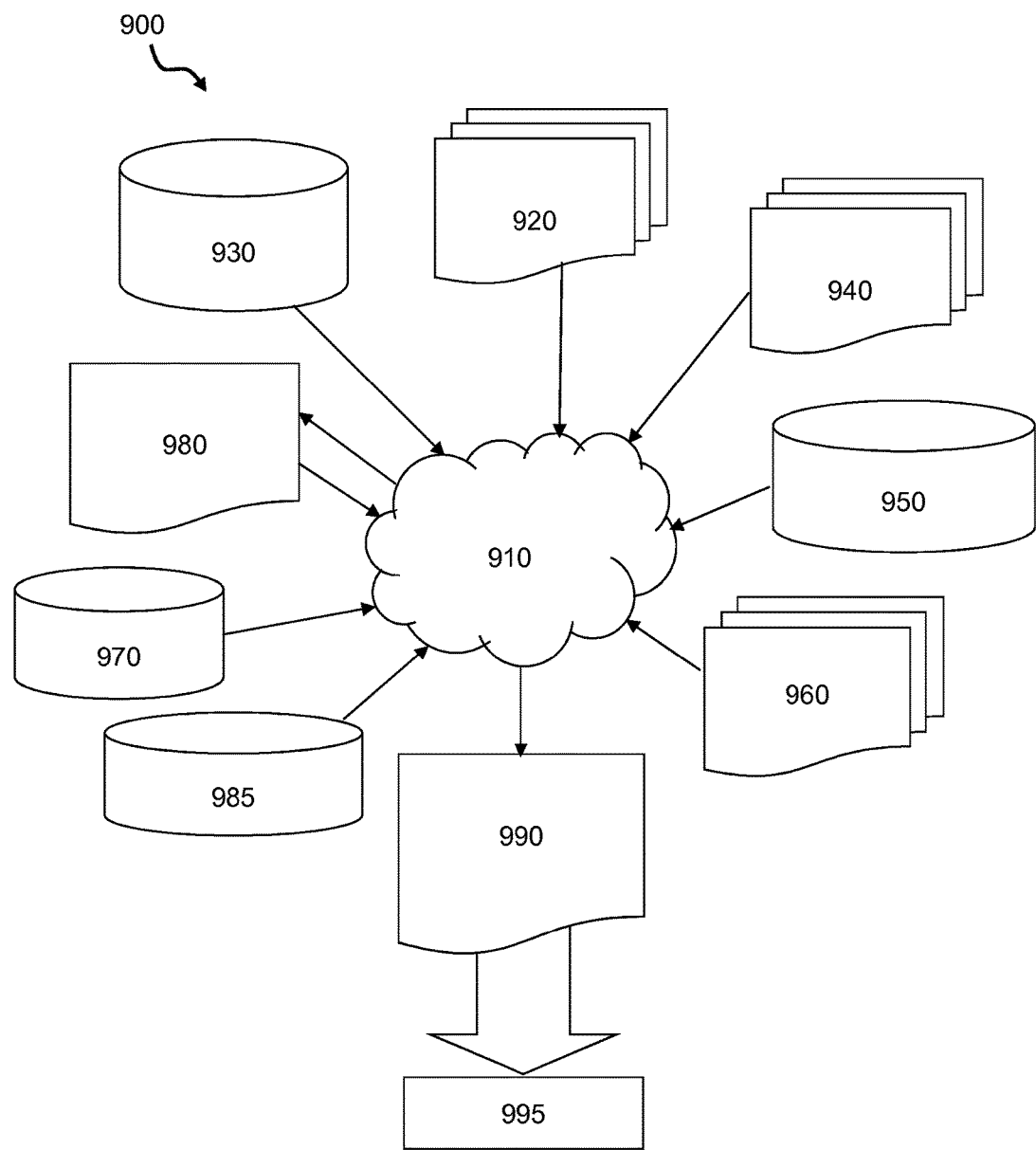
FIG. 17 is a schematic flow diagram of a design process used in semiconductor design, manufacturing, and/or test that may be applied to aspects of embodiments of the invention disclosed herein.

FIG. 17 shows a block diagram of an example design flow 900. Design flow 900 may vary depending on the type of IC being designed. For example, a design flow 900 for building an application specific IC (ASIC) may differ from a design flow 900 for designing a standard component. Design structure 920 is preferably an input to a design process 910 and may come from an IP provider, a core developer, or other design company or may be generated by the operator of the design flow, or from other sources. Design structure 920 can comprise thermoresistance-based temperature sensor 200 in the form of schematics or HDL, a hardware-description language (e.g., Verilog, VHDL, C, etc.). Design structure 920 may be contained on one or more machine readable medium. For example, design structure 920 may be a text file or a graphical representation of thermoresistance-based temperature sensor 200. Design process 910 preferably synthesizes (or translates) thermoresistance-based temperature sensor 200 into a netlist 980, where netlist 980 is, for example, a list of wires, transistors, logic gates, control circuits, I/O, models, etc., that describes the connections to other elements and circuits in an integrated circuit design and recorded on at least one of machine readable medium. This may be an iterative process in which netlist 980 is re-synthesized one or more times depending on design specifications and parameters for the circuit.

Design process 910 may include using a variety of inputs; for example, inputs from library elements 930 which may house a set of commonly used elements, circuits, and devices, including models, layouts, and symbolic representations, for a given manufacturing technology (e.g., different technology nodes, 32 nm, 45 nm, 90 nm, etc.), design specifications 940, characterization data 950, verification data 960, design rules 970, and test data files 985 (which may include test patterns and other testing information). Design process 910 may further include, for example, standard circuit design processes such as timing analysis, verification, design rule checking, place and route operations, etc. One of ordinary skill in the art of integrated circuit design can appreciate the extent of possible electronic design automation tools and applications used in design process 910 without deviating from the scope and spirit of the invention. The design structure of the invention is not limited to any specific design flow.

Ultimately, design process 910 preferably translates thermoresistance-based temperature sensor 200, 300, along with the rest of the integrated circuit design (if applicable), into a final design structure 990 (e.g., information stored in a GDS storage medium). Final design structure 990 may comprise information such as, for example, test data files, design content files, manufacturing data, layout parameters, wires, levels of metal, vias, shapes, test data, data for routing through the manufacturing line, and any other data required by a semiconductor manufacturer to produce thermoresistance-based temperature sensor 200, 300. Final design structure 980 may then proceed to a stage 985 where, for example, final design structure 980 proceeds to tape-out, is released to manufacturing, is sent to another design house or is sent back to the customer.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A thermoresistance sensor structure for an integrated circuit comprising:
   a first layer of material of an integrated circuit;
   first and second front-end-of-line (FEOL) resistors made from a first resistor material including a first material of the first layer, the first resistor material having a first thermal coefficient of resistance (TCR), the first and second resistors having respective first and second resistance values at a reference temperature;
   third and fourth resistors made from a second resistor material including one of the first material of the first layer or a second material of a second layer of the integrated circuit, the second resistor material having a second TCR that differs from the first TCR by a predetermined TCR difference, the third and fourth resistors having respective second and fourth resistance values at the reference temperature; and
   metal wires from a 1× back-end-of-line (BEOL) metallization (Mn) layer of the integrated circuit that form a Wheatstone bridge by connecting the first FEOL resistor and the fourth resistor in series as part of a first leg of the Wheatstone bridge, and connecting the second FEOL resistor and the third resistor in series as part of a second leg of the Wheatstone bridge, wherein the first and second FEOL resistors are opposed relative to each other within the Wheatstone bridge, the third and fourth resistors are opposed relative to each other within the Wheatstone bridge, an output voltage of the Wheatstone bridge is a predefined value at the reference temperature, and the output voltage is indicative of a difference in temperature between a current temperature of the bridge and the reference temperature according to a predefined relationship between at least the first TCR, the second TCR, the first, second, third, and fourth resistance values, and the difference in temperature.

2. The sensor of claim 1, wherein one of the first TCR or the second TCR is positive and the other of the first TCR or second TCR is negative.

3. The sensor of claim 1, wherein the first, second, third, and fourth resistance values are substantially identical at the reference temperature and the output voltage is substantially zero at the reference temperature.

4. The sensor of claim 1, wherein the first material includes a first semiconductor and the first resistor material includes semiconductor of the first layer doped with a first dopant.

5. The sensor of claim 4, wherein the third and fourth resistors are formed from the second material of the second layer.

6. The sensor of claim 5, wherein the second material includes a second semiconductor layer and the second resistor material includes semiconductor of the second semiconductor layer doped with a second dopant, the first material and the second material include the same semiconductor, and the first and second dopants include a same impurity at different concentrations.

7. The sensor of claim 5, wherein the second material includes a second semiconductor layer and the second resistor material includes semiconductor of the second semiconductor layer doped with a second dopant, the first material and the second material include the same semiconductor, and the first and second dopants include different impurities.

8. The sensor of claim 1, wherein the second layer is a middle-of-line (MOL) metal layer of the integrated circuit deposited prior to a first back-end-of-line (BEOL) layer of material.

9. The sensor of claim 8, wherein the second material includes at least one of a semiconductor or a metal.

10. The sensor of claim 1, wherein the first FEOL resistor, the second FEOL resistor, the third resistor, and the fourth resistor are formed from the first material of the first layer.

11. The sensor of claim 10, wherein the third and fourth resistors each include respective portions that are substantially perpendicular to the first and second FEOL resistors.

12. The sensor of claim 1, wherein the first and second FEOL resistors are planar with respect to each other, and wherein the third and fourth resistors are planar with respect to each other.

13. A thermoresistance based temperature sensor for an integrated circuit (IC), the IC having a first layer including a first material and a second layer including a second material, the sensor comprising:
   a first front-end-of-line (FEOL) resistor formed in the first layer, the first FEOL resistor having a first resistance value at a reference temperature and a first thermal coefficient of resistance (TCR);
   a second FEOL resistor formed in the first layer, the second FEOL resistor having substantially the first resistance value at the reference temperature and a second TCR, the first TCR and the second TCR differing by a predetermined TCR difference;
   a third resistor in one of the first layer or the second layer and having substantially the first resistance value at the reference temperature;
   a fourth resistor made in the one of the first layer or the second layer and having substantially the first resistance value at the reference temperature; and
   metal wires from a 1× back-end-of-line (BEOL) metallization layer Mn of the integrated circuit that connect the first FEOL resistor, the second FEOL resistor, the third resistor, and the fourth resistor to form a Wheatstone bridge above a component of the IC to be monitored, the first FEOL resistor and the fourth resistor being in a first leg of the Wheatstone bridge, the second FEOL resistor and the third resistor being in a second leg of the Wheatstone bridge, such that the first and second FEOL resistors are opposed relative to each other within the Wheatstone bridge and the third and fourth resistors are opposed relative to each other within the Wheatstone bridge.

14. The sensor of claim 13, wherein the first material includes a first semiconductor material and the first and second FEOL resistors include first and second respective resistance areas of the first layer doped with a first impurity to yield the first TCR, the third and fourth resistors include respective third and fourth resistance areas filled with material from a middle-of-line (MOL) metal layer that includes at least one of a semiconductor material or a metal deposited prior to a first BEOL material layer.

15. The sensor of claim 13, wherein the first material includes a first semiconductor material, the first and second FEOL resistors include first and second respective resistance areas of the first layer doped with a first impurity to yield the first TCR, and the third and fourth resistors include respective third and fourth resistance areas doped with a second impurity to yield the second TCR.

16. The sensor of claim 15, the third and fourth resistance areas are in the first layer.

17. The sensor of claim 15, wherein the second material includes a second semiconductor material, and the third and fourth resistance areas are in the second layer.

18. The sensor of claim 13, wherein the first and second FEOL resistors are planar with respect to each other, and wherein the third and fourth resistors are planar with respect to each other.

* * * * *